(12) United States Patent
Story

(10) Patent No.: US 9,240,754 B2
(45) Date of Patent: Jan. 19, 2016

(54) FREQUENCY FINE TUNING

(71) Applicant: QUALCOMM TECHNOLOGIES INTERNATIONAL, LTD., Cambridge (GB)

(72) Inventor: Michael John Story, Whittlesford (GB)

(73) Assignee: Qualcomm Technologies International, LTD., Cambridge (GB)

( * ) Notice: Subject to any disclaimer, the term of this patent is extended or adjusted under 35 U.S.C. 154(b) by 42 days.

(21) Appl. No.: 14/143,158

(22) Filed: Dec. 30, 2013

(65) Prior Publication Data

US 2015/0188489 A1    Jul. 2, 2015

(51) Int. Cl.
| | |
|---|---|
| H03L 7/099 | (2006.01) |
| H03B 5/12 | (2006.01) |
| H03B 1/00 | (2006.01) |
| H03L 5/00 | (2006.01) |

(52) U.S. Cl.
CPC .................. *H03B 5/124* (2013.01); *H03B 1/00* (2013.01); *H03B 5/1212* (2013.01); *H03B 5/1228* (2013.01); *H03L 5/00* (2013.01)

(58) Field of Classification Search
CPC .......... H03L 5/00; H03B 1/00; H03B 5/1212; H03B 5/1228; H03B 5/124
USPC ........... 331/57, 167, 117 FE, 185, 183, 117 R
See application file for complete search history.

(56) References Cited

U.S. PATENT DOCUMENTS

| | | | |
|---|---|---|---|
| 4,099,122 A | 7/1978 | van Buul | |
| 5,221,910 A | 6/1993 | Tournier | |
| 6,441,767 B1 | 8/2002 | Frazier | |
| 6,741,123 B1 | 5/2004 | Andersen et al. | |
| 7,113,119 B2 | 9/2006 | Van Veldhoven et al. | |
| 7,265,625 B2 | 9/2007 | Klemmer | |
| 7,450,045 B2 | 11/2008 | Liu | |
| 7,705,577 B2 | 4/2010 | Li et al. | |
| 8,354,886 B2 | 1/2013 | Brekelmans | |
| 8,519,878 B2 | 8/2013 | Jensen et al. | |
| 2003/0216863 A1 | 11/2003 | Fielder | |
| 2004/0190660 A1 | 9/2004 | Morris et al. | |
| 2005/0012481 A1 | 1/2005 | Kang et al. | |
| 2005/0111318 A1 | 5/2005 | Nakajima et al. | |

(Continued)

FOREIGN PATENT DOCUMENTS

| | | |
|---|---|---|
| CN | 101425780 A | 5/2009 |
| CN | 101895265 A | 11/2010 |

(Continued)

OTHER PUBLICATIONS

GB Search Report issued in related GB Application No. 1413957.0, dated Dec. 29, 2014.

(Continued)

*Primary Examiner* — Arnold Kinkead
(74) *Attorney, Agent, or Firm* — Procopio, Cory, Hargreaves & Savitch LLP

(57) ABSTRACT

An oscillator includes an oscillating circuit for generating an output signal having an output signal frequency. The oscillating circuit includes an inductive element and a capacitive element, the capacitive element having a variable capacitance for coarsely tuning the output signal frequency. The oscillator further includes a current supply for supplying current to the oscillating circuit, the current supply being variable for finely tuning the output signal frequency.

8 Claims, 3 Drawing Sheets

(56) References Cited

U.S. PATENT DOCUMENTS

| | | |
|---|---|---|
| 2005/0174184 A1 | 8/2005 | Wu |
| 2006/0097798 A1 | 5/2006 | Cojocaru |
| 2006/0103462 A1 | 5/2006 | Capofreddi et al. |
| 2007/0013570 A1 | 1/2007 | Gaggl et al. |
| 2008/0018508 A1 | 1/2008 | Filipovic et al. |
| 2008/0018514 A1 | 1/2008 | Ryu |
| 2008/0019066 A1 | 1/2008 | Meagher et al. |
| 2012/0025921 A1* | 2/2012 | Yang et al. ............. 331/117 FE |
| 2012/0146819 A1 | 6/2012 | Silva et al. |
| 2012/0201400 A1 | 8/2012 | Ayres |
| 2013/0071113 A1 | 3/2013 | Mckinstrie |
| 2013/0141176 A1* | 6/2013 | Andrabi et al. ......... 331/117 FE |
| 2013/0181783 A1* | 7/2013 | Upadhyaya ............. 331/117 FE |
| 2013/0187803 A1 | 7/2013 | Kaald |
| 2013/0308960 A1 | 11/2013 | Horikoshi, et al. |
| 2014/0062749 A1 | 3/2014 | Takaike et al. |
| 2015/0188495 A1 | 7/2015 | Story |
| 2015/0194975 A1 | 7/2015 | Miaille et al. |

FOREIGN PATENT DOCUMENTS

| | | |
|---|---|---|
| EP | 0 942 531 A2 | 9/1999 |
| EP | 1801977 A1 | 6/2007 |
| JP | 2004282479 A | 10/2004 |
| JP | 2006314059 A | 11/2006 |
| KR | 101105380 B1 | 1/2012 |
| WO | 03049280 | 6/2003 |
| WO | 2006103626 A1 | 10/2006 |
| WO | 2009150611 A1 | 12/2009 |
| WO | WO 2012/050676 A1 | 4/2012 |

OTHER PUBLICATIONS

GB Search Report issued in related GB Application No. 1413955.4, dated Jan. 26, 2015.

GB Search Report issued in related GB Application No. 1413956.2, dated Aug. 14, 2015, pp. 2.

GB Search Report issued in related GB Application No. 1413956.2, dated Jan. 28, 2015.

\* cited by examiner

FREQUENCY FINE TUNING

This invention relates to oscillators, in particular oscillators whose operating frequency can be finely tuned.

BACKGROUND

A typical radio transceiver comprises an antenna, a signal processing unit for baseband processing of received signals and signals that are to be transmitted. Between the antenna and the signal processing unit are a receive chain and a transmit chain. The receive chain converts received radio frequency (RF) signals down to baseband for further processing by the signal processing unit. The transmit chain generally converts signals from baseband to RF for transmission from the antenna. The receive chain comprises an input amplifier which amplifies the received signal, a mixer which mixes the amplified signals with a signal from a local oscillator (LO) to convert to Intermediate frequency (IF), and another mixer which mixes the IF signal with a signal from another oscillator to convert to baseband. The transmit chain can comprise another mixer which mixes the baseband signals with a signal from another LO to upconvert to RF and an output amplifier which amplifies the RF signals for transmission.

The LOs in the transmit and receive chains could be constituted by a single oscillator. The LOs signals may be required to switch from one frequency to another in order to transmit or receive on different frequencies. This requires the LO to tune to the desired frequency in a rapid and accurate manner.

Furthermore, in many applications it would be desirable, in order to reduce size and cost, to implement the entire transceiver, on a single integrated circuit (IC). One particular difficulty in designing such an IC is the implementation of the LOs and the circuitry required to tune the LOs to the desired operational frequencies. Additionally, there is increasing market demand for lower power products.

There is therefore a need for an accurately tunable LO whilst utilising a small on-chip area and low power.

SUMMARY OF INVENTION

According to a first aspect of the disclosure, there is provided an oscillator comprising: an oscillating circuit for generating an output signal having an output signal frequency, the oscillating circuit comprising an inductive element and a capacitive element, the capacitive element having a variable capacitance for coarsely tuning the output signal frequency; and a current supply for supplying current to the oscillating circuit, the current supply being variable for finely tuning the output signal frequency.

Suitably, the oscillator further comprises a first pair of cross coupled transistors, a first transistor of the first pair being coupled to a first terminal of the inductive element and a second transistor of the first pair being coupled to the second terminal of the inductive element.

Suitably, the current supply is coupled to the first pair of cross coupled transistors, the fine tuning of the output signal frequency being dependent on the bias across each of the transistors.

Suitably, each of the cross coupled transistors has a parasitic capacitance, the fine tuning of the output signal frequency being dependent on the parasitic capacitances.

Suitably, the current supply is coupled to the oscillating circuit via the first pair of cross coupled transistors.

Suitably, the oscillator further comprises a second pair of cross coupled transistors, a particular transistor of the second pair of transistors being coupled to said first terminal and said first transistor, and the other transistor of the second pair being coupled to the second terminal and the second transistor.

Suitably, the current supply is coupled to the first pair of cross coupled transistors, the fine tuning of the output signal frequency being dependent on the current supplied to the first and second pairs of cross coupled transistors.

Suitably, the first pair of transistors are PMOS transistors and the second pair of transistors being NMOS transistors.

Suitably, the current supply comprises a first current source and a second current source, the first current source being configured to supply a current greater than current supplied by the second current source, the second current source being variable so as to vary the current supply for finely tuning the output signal frequency.

Suitably, the first and second current sources are digital-to-analogue converters.

Suitably, the current supply further comprises a switch coupling the first current source to the second current source and being controllable so as to enable the fine tuning of the output signal frequency.

Suitably, the oscillator is configured such that varying the current fine tunes the output signal frequency at a resolution of between 100 kHz/μA and 300 kHz/μA.

BRIEF DESCRIPTION OF THE DRAWINGS

The present invention will now be described by way of example with reference to the accompanying drawings, in which.

DETAILED DESCRIPTION

The following description is presented to enable any person skilled in the art to make and use the invention, and is provided in the context of a particular application. Various modifications to the disclosed embodiments will be readily apparent to those skilled in the art.

The general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

In general, an oscillator can be implemented around an oscillating circuit such as an LC resonator. The frequency of the oscillator can be a function of L and C. For example, in a LC based oscillator the frequency of oscillation can be changed by changing the capacitance of the capacitor across the tank.

Figure 1:
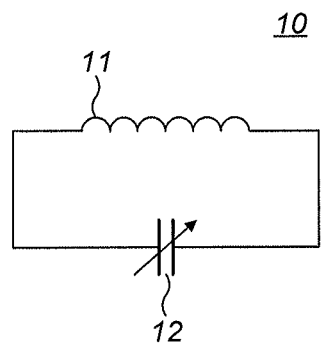
FIG. 1 illustrates a known LC tank.
Figure 2:
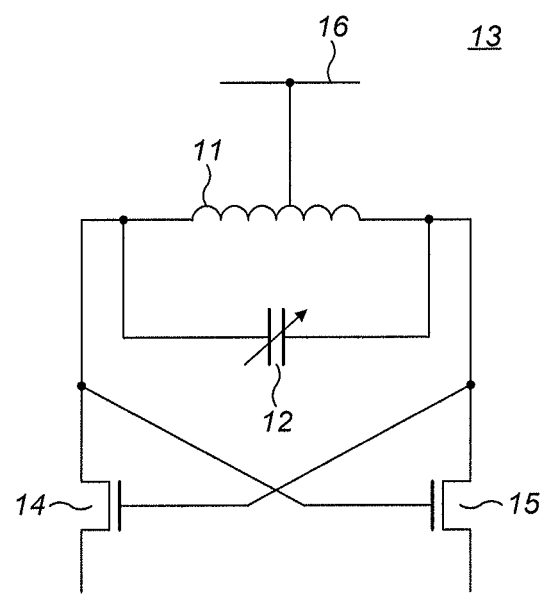
FIG. 2 illustrates a known voltage controlled oscillator.

The general structure of a prior art oscillator LC tank 10 is shown in the FIG. 1, which comprises an inductance source 11 and a capacitance source 12 coupled across the inductance source 11. This LC tank 10 along with an active circuit builds a conventional VCO core 13 as shown in FIG. 2. The active circuit comprises a pair of cross coupled field effect transistors 14 and 15 and a voltage source 16.

The frequency of oscillation of the LC tank 10 is dependent on the capacitance of the capacitance source 12. By varying the capacitance of capacitance source 12, the LC tank 10 can be tuned to a desired oscillating frequency. This can then be used to output a signal at the desired oscillating frequency.

A suitable implementation for the capacitance source 12 is switchable bank of unit capacitors. This implementation can be advantageous because a bank of capacitors provides very linear and precise frequency steps. However, a problem with this approach is that the size of the unit capacitors can become so small that the circuit cannot be implemented in a practical sense. As an example, if the maximum oscillator frequency is 2.4 GHz and the wanted step size is 10 kHz, an oscillator having an inductance of 10 nH would require a total capacitance of 0.44 pF. The unit capacitance needed to provide the required step size would be 3.6 aF. However, the minimum capacitance that, typically, can be reliably manufactured is 3 fF. This could restrict how finely the oscillation frequency can be tuned to.

Figure 3:
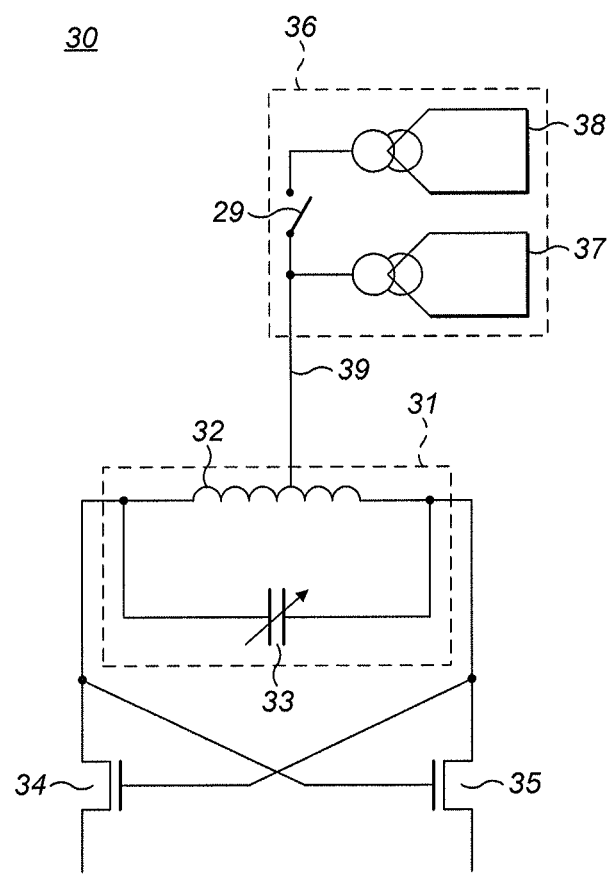
FIG. 3 illustrates an exemplary oscillator.

FIG. 3 depicts an oscillator 30. Oscillator 30 is capable of overcoming the restriction caused by the minimum capacitance and is able to provide finer frequency tuning. The oscillator 30 comprises an LC tank 31, which comprises an inductive element 32 and a capacitive element 33 coupled across the inductive element 32. The inductive element 32 may comprise more than one inductive element connected in series or the inductive element 32 can be a single inductor element The capacitive element 33 may comprise one or more variable capacitors, a switchable bank of capacitors, or any other suitable means for providing a variable capacitance. The capacitance ($C_v$) of the capacitive element 33 can be varied and controlled to tune the oscillator to oscillate at or close to a desired frequency. The LC tank 31 can oscillate to provide an output signal having the same frequency as the LC tank 31 oscillation.

The oscillator 30 may comprise a pair of cross coupled transistors 34 and 35. Transistor 34 can be coupled to one terminal of the inductive element 32 and transistor 35 can be coupled to the other terminal of inductive element 32.

The oscillator 30 comprises a current supply 36 which supplies current to the LC tank 31 and the transistors 34 and 35. The current supply 36 is variable so that the operating current of the oscillator can be controllably varied. The current supply 36 can also be varied to tune the frequency at which the LC tank 31 oscillates. Tuning of the LC tank 31 by varying the current supply is possible because of parasitic capacitances that can exist in the circuit.

Below describes how the parasitic capacitance ($C_{MOS}$) of the cross coupled transistors 34 and 35 can be utilised tune of the oscillation frequency. However, the source of the parasitic capacitance may be from other sources such as signal paths.

The LC tank 31 tunes to a frequency of:

$$(\sqrt{2}\pi LC_{eff})^{-1}$$

where: $C_{eff} = C_v + C_{MOS}$

Traditionally, $C_{MOS}$ is unwanted and oscillators are designed to minimise $C_{MOS}$ as much as possible. However, as shown by the equation above, if the $C_{MOS}$ can be varied it would be possible to use this capacitance to tune the frequency of the LC tank 31.

The LC tank 31 has a finite impedance to the supply current. At low currents and low oscillation amplitudes, the impedance is negative, but at high currents and high amplitudes the impedance is positive. For a chosen operating region, a change in operating current causes a change in average bias voltage across the transistors 34 and 35, which leads to a change in $C_{MOS}$ as this is voltage dependent. The change in $C_{MOS}$ can vary with device dimensions, being a combination of junction capacitance (which increases as average voltage decreases) and gate capacitance (which decreases as voltage decreases) but can be well defined for a given device geometry. Thus, a change in operating current can be used to vary the frequency of the LC tank 31.

The rate or resolution at which the frequency of the LC tank 31 changes with the current supplied can be predictable and therefore the frequency can be controlled by means of the supply current. Furthermore, the change in frequency with current for the oscillator is stable over a range of temperatures. The rate of change of the frequency with current is dependent on the ratio of $C_{MOS}/C_V$. Providing a smaller $C_{MOS}/C_V$ provides smaller shifts in the frequency and thus finer frequency control. However, there may be a practical limit to how small the $C_{MOS}/C_V$ ratio may be as making $C_{MOS}$ small by making transistors 34 and 35 too small would lead to a decrease in the transconductance/current ($g_m/\mu A$) ratio and thus an increase in the operating current requirements. Making $C_{MOS}/C_V$ smaller may also lead to an increase in noise.

Preferably, the ratio of $C_{MOS}/C_V$ is such that a fine tuning resolution of between 100 kHz/$\mu$A and 300 kHz/$\mu$A can be provided. Even more preferably, a fine tuning resolution of 125 kHz/$\mu$A is provided. This resolution is particularly useful for fine tuning LOs used in transceivers for transmitting and receiving Bluetooth signals. Furthermore, at this resolution, noise from current sources does not have a significant effect on the control of the current for the frequency tuning.

The capacitance of the capacitive element 33 can be varied by a controller (not shown). The current supplied by the current supply 36 can also be varied by the controller. The controller can select an operating frequency of the oscillator 30 by varying the capacitance of the capacitive element 33 and/or current supplied by the current supply 36. The capacitance $C_v$, (provided by the capacitive element 33) can be used for coarse frequency tuning. The current provided by the current supply 36 can be used for fine frequency tuning.

Due to the fine control of the current required, it is preferable that the oscillator 30 comprises its own current supply rather than being provided by a main power supply rail. The current supply 36 may comprise a first current source 37 and a second current source 38. The first current source 37 may be a fixed current source or a variable current source that is coarsely variable. The second current source 38 may be a variable current source that is finely variable. The first and second current sources 37 and 38 may be coupled to a supply line 39 for supplying current to the LC tank 31. The second current source 38 may be controllable by a controller so that the level of current provided by second current source 38 can be used for fine frequency tuning. A switch 29 may be provided between second current source 38 and the supply line which allows the controller to enable or disable the fine frequency control.

The first and second current sources 37 and 38 may be digital-to-analogue converters (DACs), which can provide fine digital control of the current.

Figure 4:
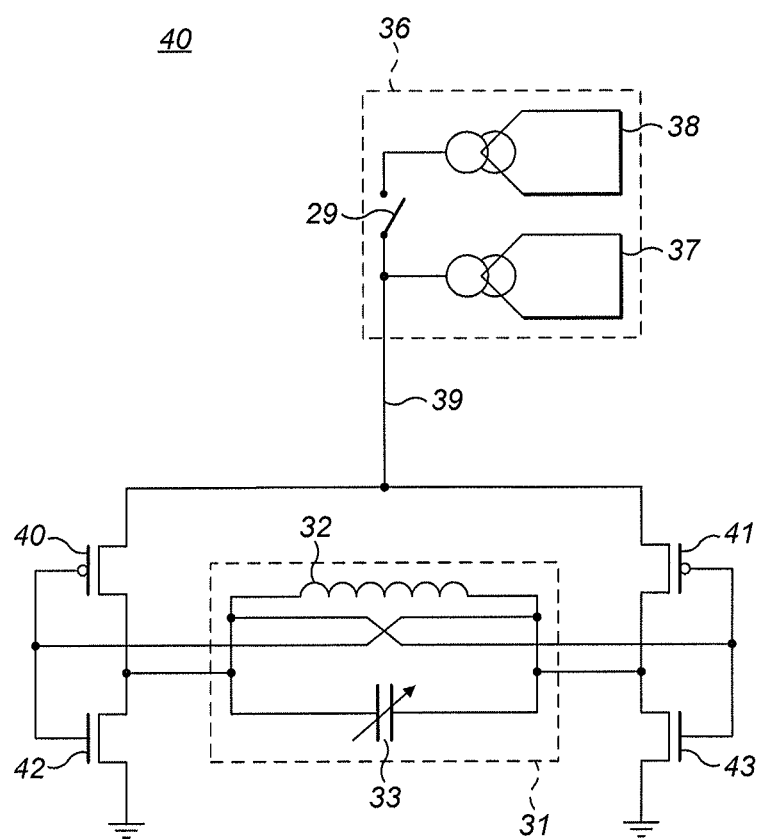
FIG. 4 illustrates another exemplary oscillator.

FIG. 4 depicts the oscillator 40 which is the same as oscillator 30 but with cross coupled transistors 34 and 35 being replaced with two pairs of cross coupled transistors 40, 41 and 42 and 43. The sources of the first pair of transistors 40 and 41 are coupled to supply line 39. The drain of transistor 40 is coupled to the first terminal of the inductive element 31 and transistor 42 of the second pair of transistors 42 and 43. The drain of transistor 41 is coupled to the second terminal of the inductive element 32 and transistor 43. The gates of transistors 40 and 42 are coupled to each other and to the second terminal of the inductive element 32. The gates of transistors 41 and 43 are coupled to each other and to the first terminal of the inductive element. Transistors 40 and 41 may be PMOSs and transistors 42 and 43 may be NMOSs. Each of the transistors 40, 41, 42 and 43 can provide a parasitic capacitance $C_{MOS}$ that can be used for fine tuning the oscillation frequency of the LC tank 31, as described herein.

The LC tank 31 has losses that can be modelled as a resistor in parallel with the LC arrangement. The value is usually approximately $Q \cdot Z_L$ where $Z_L$ is the impedance of the inductor and Q is the quality factor. For the arrangement of FIG. 3, to oscillate, the $g_m$ of transistors 34 and 35 have to exceed $1/(Q \cdot Z_L)$. The $g_m$ of the transistors 34 and 35 is proportional to operating current and moves to proportional to $\sqrt{}$(operating current) as the transistors 34 and 35 moves further into saturation. Either way, a greater $g_m$ leads to a greater current requirement, which can be disadvantageous. Using the arrangement of FIG. 4, twice as much $g_m$ for a given operating current is possible, since the same current goes through one PMOS and one NMOS—so the operating current is halved. Furthermore, the arrangement FIG. 4 allows the inductor to be a two terminal device rather than a three terminal device, which provides easier inductor design.

Fine frequency tuning by varying the current has a number of advantages over traditional fine tuning techniques. For example, providing a bank of capacitors for fine frequency tuning can lead to low Q LC tank due to the circuitry required for the bank. However, by providing fine frequency tuning by varying the current supplied, such extra circuitry is not required and therefore a higher Q LC tank can be provided.

Providing a current supply instead of a voltage supply also has additional benefits for controlling the oscillator and negating some of the unwanted effects caused by manufacturing tolerances. The transconductance of the transistors is predominantly dependent on operating current, and to a lesser extent operating current density (which depends on geometry, which can be a very well controlled parameter). Manufacturing tolerances for other parameters (such as oxide thickness, doping profile, etc) have much less of an effect, although they do affect operating voltage. So, control of operating voltage to achieve the required currents to achieve the required transconductances requires control in fine increments (for fine control) in an overall range that has to be increased to cover more manufacturing tolerances, and so is more problematic for the circuitry.

The oscillator described herein is suitable for use with mixers in transceivers for radio frequency signals communicated according to any radio frequency protocol. For example, it is suitable for use with transceivers that communicate radio frequency signals according to Bluetooth protocols.

The examples above describe arrangements in which two elements are coupled. This is intended to mean that those two elements are physically connected. However the two elements are not necessarily directly connected. For example, there may be intermediary elements in between the two elements which are coupled.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. An oscillator comprising:
    an oscillating circuit for generating an output signal having an output signal frequency, the oscillating circuit comprising an inductive element and a capacitive element, the capacitive element having a variable capacitance for coarsely tuning the output signal frequency;
    a first pair of cross coupled transistors, a first transistor of the first pair being coupled to a first terminal of the inductive element and a second transistor of the first pair being coupled to the second terminal of the inductive element;
    a second pair of cross coupled transistors, a particular transistor of the second pair of transistors being coupled to said first terminal and said first transistor, and the other transistor of the second pair being coupled to the second terminal and the second transistor; and
    a current supply for supplying current to the oscillating circuit, the current supply being variable for finely tuning the output signal frequency, the current supply being coupled to the first pair of cross coupled transistors, the fine tuning of the output signal frequency being dependent on the current supplied to the first and second pairs of cross coupled transistors.

2. An oscillator as claimed in claim 1, the current supply being coupled to the first pair of cross coupled transistors, the fine tuning of the output signal frequency being dependent on the bias across each of the transistors.

3. An oscillator as claimed in claim 1, each of the cross coupled transistors having a parasitic capacitance, the fine tuning of the output signal frequency being dependent on the parasitic capacitances.

4. An oscillator as claimed in claim 1, the first pair of transistors being PMOS transistors and the second pair of transistors being NMOS transistors.

5. An oscillator, comprising:
    an oscillating circuit for generating an output signal having an output signal frequency, the oscillating circuit comprising an inductive element and a capacitive element, the capacitive element having a variable capacitance for coarsely tuning the output signal frequency; and
    a current supply for supplying current to the oscillating circuit, the current supply being variable for finely tuning the output signal frequency, the current supply comprising a first current source and a second current source, the first current source being configured to supply a current greater than current supplied by the second current source, the second current source being variable so as to vary the current supply for finely tuning the output signal frequency.

6. An oscillator as claimed in claim 5, wherein the first and second current sources are digital-to-analogue converters.

7. An oscillator as claimed in claim 5, the current supply further comprising a switch coupling the first current source to the second current source and being controllable so as to enable the fine tuning of the output signal frequency.

8. An oscillator, comprising:
    an oscillating circuit for generating an output signal having an output signal frequency, the oscillating circuit comprising an inductive element and a capacitive element, the capacitive element having a variable capacitance for coarsely tuning the output signal frequency; and
    a current supply for supplying current to the oscillating circuit, the current supply being variable for finely tuning the output signal frequency,
    the oscillator being configured such that varying the current fine tunes the output signal frequency at a resolution of between 100 kHz/µA and 300 kHz/µA.

* * * * *